United States Patent
Chung et al.

(10) Patent No.: US 10,844,491 B2
(45) Date of Patent: *Nov. 24, 2020

(54) GAS SUPPLY UNIT AND SUBSTRATE PROCESSING SYSTEM

(71) Applicant: Samsung Electronics Co., Ltd., Suwon-si (KR)

(72) Inventors: Sukjin Chung, Hwaseong-si (KR); JongCheol Lee, Seoul (KR); MinHwa Jung, Hwaseong-si (KR); Jaechul Shin, Suwon-si (KR); In-Sun Yi, Seoul (KR); Geunkyu Choi, Hwaseong-si (KR); Jungil Ahn, Suwon-si (KR); Seung Han Lee, Pyeongtaek-si (KR); Jin Pil Heo, Pyeongtaek-si (KR)

(73) Assignee: Samsung Electronics Co., Ltd. (KR)

( * ) Notice: Subject to any disclaimer, the term of this patent is extended or adjusted under 35 U.S.C. 154(b) by 321 days.

This patent is subject to a terminal disclaimer.

(21) Appl. No.: 15/289,619

(22) Filed: Oct. 10, 2016

(65) Prior Publication Data
US 2017/0121820 A1    May 4, 2017

(30) Foreign Application Priority Data

Oct. 30, 2015 (KR) .......................... 10-2015-0151511

(51) Int. Cl.
*C23C 16/52* (2006.01)
*C23C 16/455* (2006.01)
*C23C 16/44* (2006.01)

(52) U.S. Cl.
CPC .......... *C23C 16/52* (2013.01); *C23C 16/4412* (2013.01); *C23C 16/45544* (2013.01); *C23C 16/45551* (2013.01); *C23C 16/45563* (2013.01)

(58) Field of Classification Search
None
See application file for complete search history.

(56) References Cited

U.S. PATENT DOCUMENTS

| | | | |
|---|---|---|---|
| 6,113,700 | A | 9/2000 | Choi |
| 6,793,733 | B2 | 9/2004 | Janakiraman et al. |
| 6,872,258 | B2 | 3/2005 | Park et al. |
| 7,879,183 | B2 | 2/2011 | Yousif et al. |
| 8,747,556 | B2 | 6/2014 | Lam et al. |
| 10,041,172 | B2 * | 8/2018 | Kim ................. C23C 16/45519 |

(Continued)

FOREIGN PATENT DOCUMENTS

| | | |
|---|---|---|
| CN | 104380434 | 2/2015 |
| CN | 104412364 | 3/2015 |

(Continued)

*Primary Examiner* — Karla A Moore
(74) *Attorney, Agent, or Firm* — Myers Bigel, P.A.

(57) ABSTRACT

A substrate processing system may include a process chamber in which a process on a substrate is performed, a supporting unit in the process chamber to support the substrate, a gas supply unit including a gas supply part with gas supply holes, with the gas supply holes being configured to supply a process gas onto the substrate, and an exhaust unit configured to exhaust the process gas from the process chamber. The gas supply part may include a gas supply region provided with the gas supply holes and a gas diffusion region between the gas supply region and the exhaust unit. The gas diffusion region may be free of the gas supply holes.

20 Claims, 9 Drawing Sheets

(56) References Cited

U.S. PATENT DOCUMENTS

| | | |
|---|---|---|
| 2011/0162800 A1 | 7/2011 | Noorbakhsh et al. |
| 2012/0222616 A1 | 9/2012 | Han et al. |
| 2013/0295297 A1 | 11/2013 | Chou et al. |
| 2014/0030433 A1 | 1/2014 | Ranish |
| 2015/0122177 A1 | 5/2015 | Yang et al. |
| 2015/0136028 A1* | 5/2015 | Park ............... C23C 16/45551 118/730 |
| 2015/0140786 A1* | 5/2015 | Kwak ............... H01L 31/18 438/478 |
| 2016/0060759 A1* | 3/2016 | Kim ............... C23C 16/45565 239/296 |
| 2017/0092480 A1* | 3/2017 | Yi ............... C23C 16/45551 |
| 2018/0002808 A1* | 1/2018 | Chung ............... H01L 21/02189 |
| 2018/0320267 A1* | 11/2018 | Kim ............... C23C 16/45565 |

FOREIGN PATENT DOCUMENTS

| | | | |
|---|---|---|---|
| CN | 104471678 | 3/2015 | |
| KR | 10-1165615 | 7/2012 | |
| KR | 10-2015-0021220 | 3/2015 | |
| WO | 2010/019007 | 2/2010 | |
| WO | WO-2013180451 A1 * | 12/2013 | ............. H01L 31/18 |

\* cited by examiner

GAS SUPPLY UNIT AND SUBSTRATE PROCESSING SYSTEM

CROSS-REFERENCE TO RELATED APPLICATIONS

This U.S. non-provisional patent application claims priority under 35 U.S.C. § 119 to Korean Patent Application No. 10-2015-0151511, filed on Oct. 30, 2015, the contents of which are hereby incorporated by reference herein in their entirety.

BACKGROUND

The inventive concept relates to a gas supply unit and a substrate processing system and, in particular, to a gas supply unit configured to supply a process gas onto a substrate and a substrate processing system therewith.

In general, a semiconductor device may be fabricated through several processes, such as a deposition process, a photolithography process, and a cleaning process. The deposition process may be used to form a layer on a substrate, and it may include a chemical vapor deposition (CVD) process or an atomic layer deposition (ALD) process.

SUMMARY

Some embodiments of the inventive concept provide a substrate processing system configured to deposit a uniformly thin layer on a substrate.

According to some embodiments of the inventive concept, a substrate processing system may include a process chamber, in which a process on a substrate is performed, a supporting unit provided in the process chamber to support the substrate, a gas supply unit including a gas supply part with gas supply holes, with the gas supply holes being configured to supply a process gas onto the substrate, and an exhaust unit configured to exhaust the process gas from the process chamber. The gas supply part may be provided to include a gas supply region provided with the gas supply holes and a gas diffusion region provided between the gas supply region and the exhaust unit, and the gas diffusion region may be free of the gas supply holes.

In some embodiments, the gas supply part may overlap with the substrate that is supported by the supporting unit.

In some embodiments, the gas supply region may overlap with a portion of the substrate, and the gas diffusion region may overlap with another portion of the substrate.

In some embodiments, the gas diffusion region may have a flat surface facing the substrate.

In some embodiments, the gas diffusion region may be a first gas diffusion region. The gas supply region may include a plurality of gas supply regions and a second gas diffusion region provided between the plurality of gas supply regions.

In some embodiments, the exhaust unit may include a first exhaust part provided outside the gas supply unit and a second exhaust part provided in the gas supply unit, wherein the second exhaust part may be provided as a second exhaust region.

In some embodiments, the gas supply unit may further include a recess region, which may be formed on a surface thereof and may be used as the second exhaust region.

In some embodiments, the gas supply unit may include a first gas supply part configured to supply a first gas and a second gas supply part configured to supply a second gas. The recess region may be provided between the first and second gas supply parts.

In some embodiments, the second exhaust region may be configured to have a pressure lower than pressures at the gas supply region and the gas diffusion region.

In some embodiments, the exhaust unit may be provided outside the gas supply unit.

In some embodiments, at least a portion of the exhaust unit may be provided in the gas supply unit.

In some embodiments, the gas supply region may have a length that is greater than or equal to that of the gas diffusion region.

In some embodiments, the gas supply part may have an arc shape and extend radially outwardly from a center portion of the gas supply unit to an outer portion of the gas supply unit, and a radial length of the gas supply region may be greater than or equal to that of the gas diffusion region.

In some embodiments, the gas supply part may have an arc shape and extend radially outwardly from a center portion of the gas supply unit to an outer portion of the gas supply unit, and a radial length of the gas supply region may be smaller than that of the gas diffusion region.

In some embodiments, the gas supply part may have an arc shape and extend radially outwardly from a center portion of the gas supply unit to an outer portion of the gas supply unit, and an arc length of the gas supply region may be greater than or equal to that of the gas diffusion region.

In some embodiments, the gas supply part may have an arc shape and extend radially outwardly from a center portion of the gas supply unit to an outer portion of the gas supply unit, and an arc length of the gas supply region may be smaller than that of the gas diffusion region.

In some embodiments, a length of the gas diffusion region may range from about 5 to 200 times a distance between the gas supply holes.

According to some embodiments of the inventive concept, a substrate processing system may include a process chamber defining an internal space, a supporting unit in the internal space of the process chamber and supporting a substrate, a gas supply unit at a top portion of the process chamber, with the gas supply unit including gas supply holes configured to supply a process gas to the substrate, and an exhaust unit configured to exhaust the process gas from the process chamber. The gas supply part may include a gas supply region including a bottom surface through which the gas supply holes extend and a gas diffusion region including a flat, solid bottom surface. The supporting unit may be configured such that the substrate is positionable under the gas supply part with the gas supply region over a first portion of the substrate and the gas diffusion region over a second, different portion of the substrate.

In some embodiments, the exhaust unit may include a recessed region of the gas supply unit that extends around an outer portion of the gas supply unit. The gas supply part may extend radially outwardly from a central portion of the gas supply unit to the outer portion of the gas supply unit. The gas supply region may be adjacent the central portion of the gas supply unit. The gas diffusion region may be between the gas supply region and the recessed region that extends around the outer portion of the gas supply unit.

In some embodiments, the gas supply part may be a first gas supply part. The gas supply unit may further include a second gas supply part that is spaced apart from the first gas supply part, a third gas supply part that is spaced apart from the second gas supply part, and a fourth gas supply part that is spaced apart from the third gas supply part. The recessed region may extend between alternating ones of the first through fourth gas supply parts.

In some embodiments, the gas supply region may be a first gas supply region and the gas diffusion region may be a first gas diffusion region. The gas supply unit may further include a second gas supply region that is spaced apart from the first gas supply region and a second gas diffusion region that extends between the first and second gas supply regions.

In some embodiments, the gas supply unit may be configured such that the process gas that is supplied from the gas supply holes is diffused to a space between the gas diffusion region and the substrate.

According to some embodiments of the inventive concept, a substrate processing system may include a process chamber, in which a process on a substrate is performed, a supporting unit provided in the process chamber and configured to support the substrate, a gas supply unit with a gas supply part, the gas supply part being configured to supply a process gas onto the substrate, and an exhaust unit configured to exhaust the process gas from the process chamber. The gas supply part may include a gas supply region configured to supply the process gas onto the substrate, and a gas diffusion region configured to provide a space allowing the process gas to be diffused on the substrate. The gas supply region may include first and second spaced apart gas supply regions. The gas diffusion region may include a first gas diffusion region provided between the gas supply region and the exhaust unit and a second gas diffusion region provided between the first and second gas supply regions.

In some embodiments, the gas supply region may be configured to have gas supply holes for supplying the process gas.

In some embodiments, the gas diffusion region may have a flat surface that is devoid of gas supply holes facing the substrate.

In some embodiments, the gas supply part may overlap with the substrate supported by the supporting unit.

In some embodiments, the gas supply region may overlap with a portion of the substrate, and the gas diffusion region may overlap with another portion of the substrate.

In some embodiments, the exhaust unit may be configured to include a first exhaust part provided outside the gas supply unit and a second exhaust part provided in the gas supply unit, wherein the second exhaust part is provided as a second exhaust region.

In some embodiments, the gas supply unit may further include a recess region, which has a top surface lower than the gas supply region and the gas diffusion region and is used as the second exhaust region. The gas supply unit may be thicker at the gas supply region and the gas diffusion region than at the recess region.

In some embodiments, the gas supply unit may include a first gas supply part configured to supply a first gas, and a second gas supply part configured to supply a second gas. The recess region may be provided between the first and second gas supply parts.

In some embodiments, the gas supply region may have a length that is greater than or equal to that of the gas diffusion region.

According to some embodiments of the inventive concept, a gas supply unit may include a gas supply part. The gas supply part may be configured to supply a gas to a target object. The gas supply part may include a first region configured to allow the gas to have a first pressure, a second region configured to allow the gas to have a second pressure lower than the first pressure, and a third region between the first region and the second region. The first region may have gas supply holes for supplying the gas to the target object, and the third region may have a flat surface facing the target object.

In some embodiments, the second region may be a recess region having a surface lower than that of the first region.

In some embodiments, the gas supply part may further include a plurality of the first regions, and the third region may include a portion interposed between the plurality of the first regions.

In some embodiments, the first region may have a length that is greater than or equal to that of the third region.

BRIEF DESCRIPTION OF THE DRAWINGS

Example embodiments of the inventive concept will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. However, these drawings may not be to scale and may not precisely reflect the precise structural or performance characteristics of any given embodiment. For example, the relative size, thicknesses and/or positioning of layers, regions and/or structural elements may be reduced or exaggerated for clarity.

DETAILED DESCRIPTION

The inventive concept will now be described more fully hereinafter with reference to the accompanying drawings, in which example embodiments of the inventive concept are shown. The inventive concept and methods of achieving them will be apparent from the following example embodiments that will be described in more detail with reference to the accompanying drawings. Embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that the terms "comprises," "includes," "comprising," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it may be directly connected or coupled to the other element or intervening elements may be present. In contrast, when an element is referred to as being "directly coupled" or "directly connected" to another element, there are no intervening elements present.

Similarly, it will be understood that when an element is referred to as being "on" another element, it can be directly on the other element or intervening elements may be present. In contrast, the term "directly on" means that there are no intervening elements. As used herein the term "and/or" includes any and all combinations of one or more of the associated listed items.

The same reference numerals or the same reference designators denote the same elements throughout the specification.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
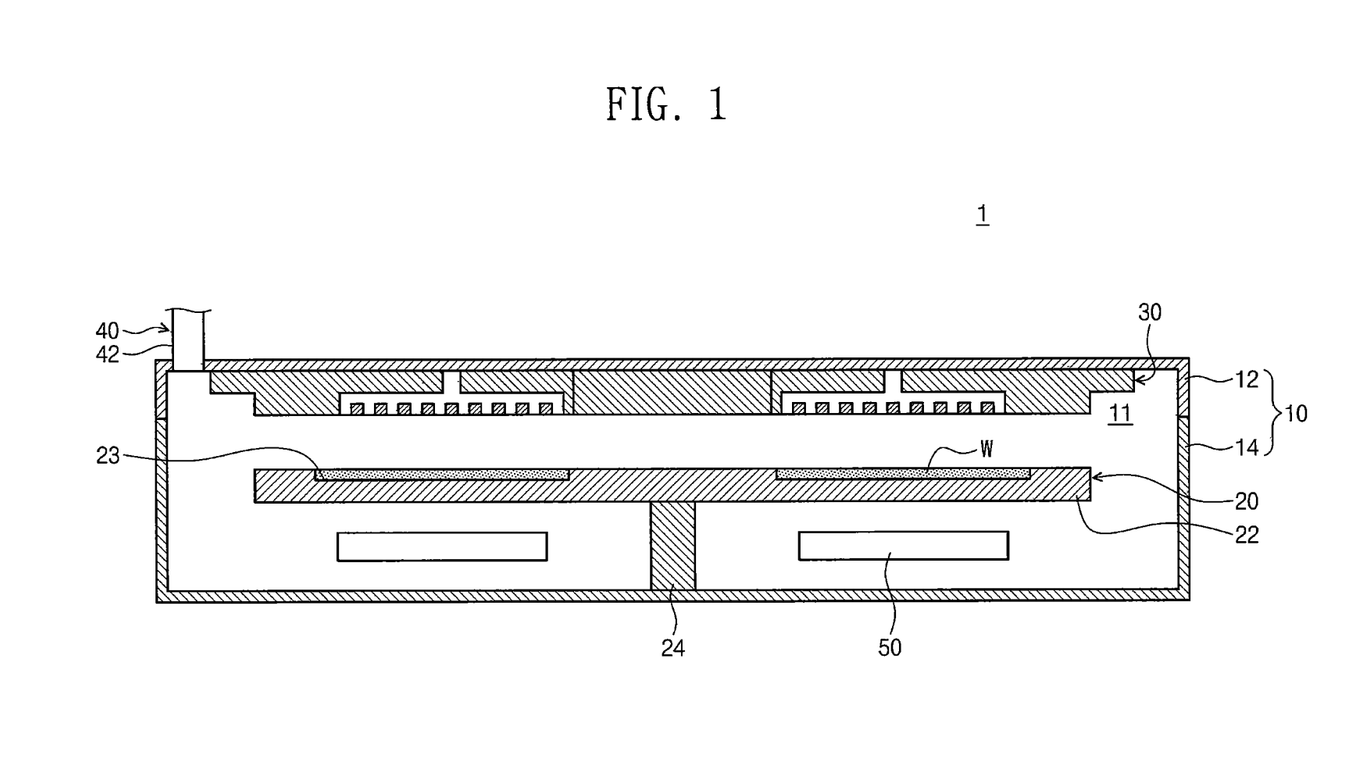
FIG. 1 is a sectional view schematically illustrating a substrate processing system according to some embodiments of the inventive concept.
Figure 2:
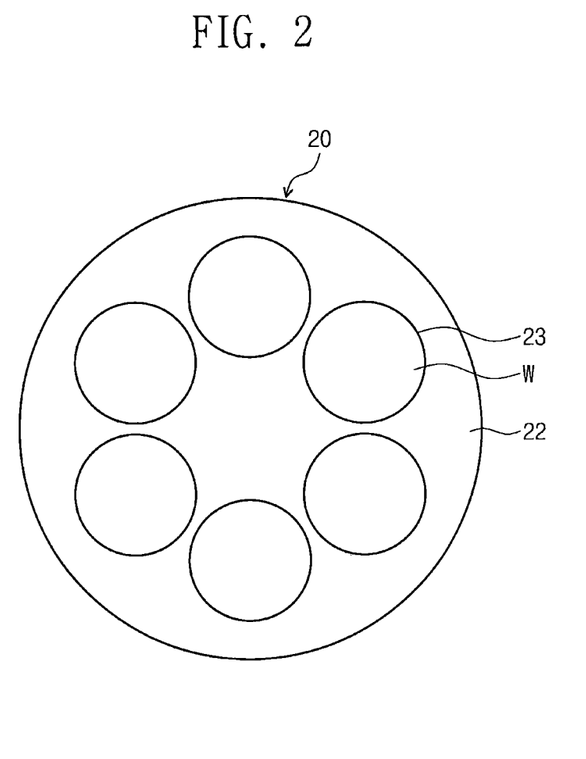
FIG. 2 is a top view illustrating a supporting unit of FIG. 1.
Figure 3A:
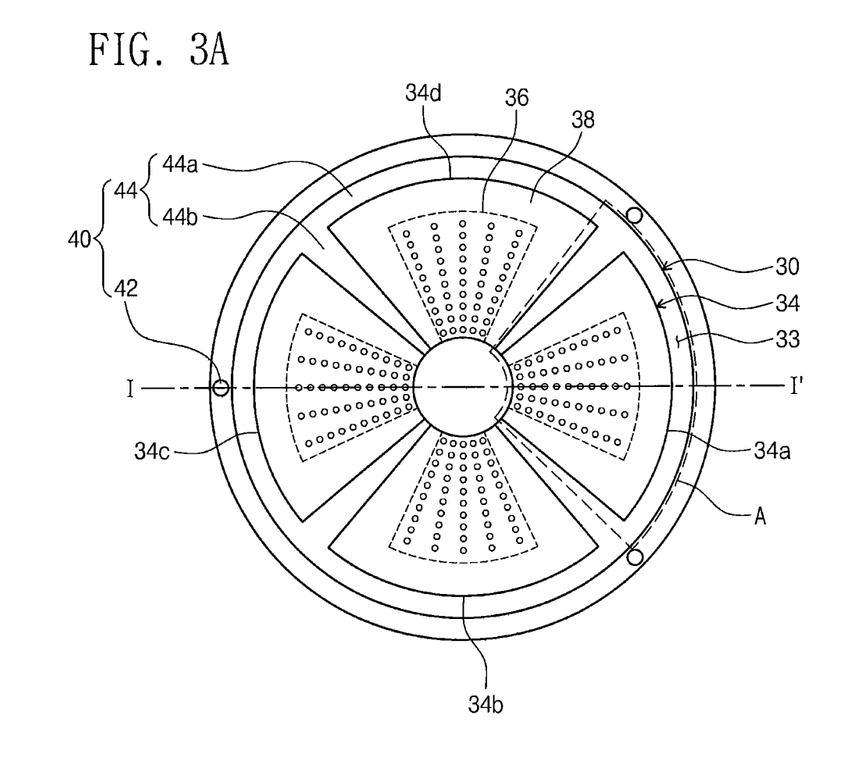
FIG. 3A is a bottom view illustrating a gas supply unit and an exhaust unit of FIG. 1.
Figure 3B:
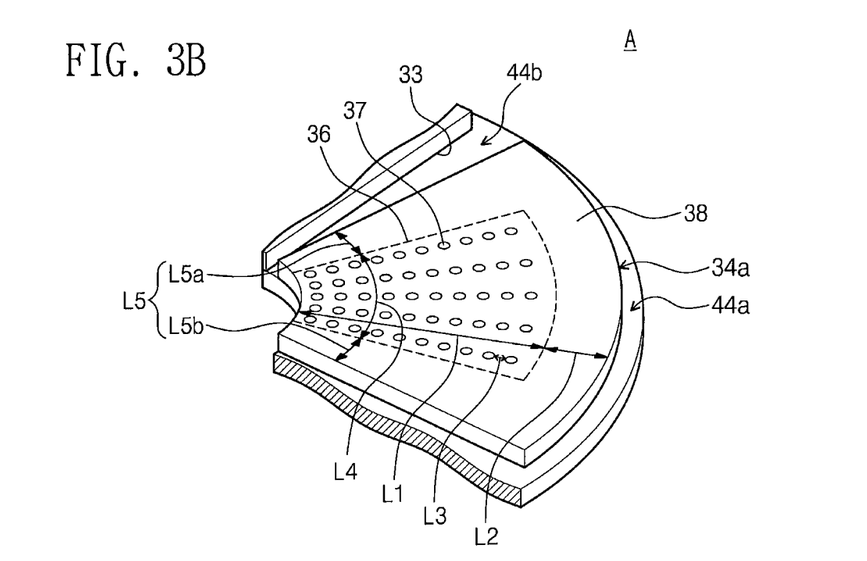
FIG. 3B is an enlarged view of a region A of FIG. 3A.

FIG. 1 is a sectional view schematically illustrating a substrate processing system 1 according to some embodiments of the inventive concept. FIG. 2 is a top view illustrating a supporting unit 20 of FIG. 1. FIG. 3A is a bottom view illustrating a gas supply unit 30 and an exhaust unit 40 of FIG. 1, and FIG. 3B is an enlarged view of a region A of FIG. 3A.

Referring to FIG. 1, a substrate processing system 1 may include a process chamber 10, a supporting unit 20, a gas supply unit 30, an exhaust unit 40, and a heating unit 50. The substrate processing system 1 may be configured to supply a process gas onto a substrate W and to perform a specific process on the substrate W. For example, the substrate processing system 1 may be configured to perform a process of depositing a thin film on the substrate W. In particular, the substrate processing system 1 may be an atomic layer deposition (ALD) system. The substrate processing system 1 may be a space division based atomic layer deposition system. The substrate W may be a semiconductor wafer, but the inventive concept is not limited thereto. Hereinafter, the substrate processing system 1 will be described in more detail with reference to FIGS. 1 to 3B.

The process chamber 10 may provide or define an internal space 11 for the process on the substrate W. The process chamber 10 may include a first chamber 12 and a second chamber 14 which are coupled to each other to define the internal space 11. For example, as shown in FIG. 1, the first chamber 12 may be an upper chamber 12 and the second chamber 14 may be a lower chamber 14. When the process on the substrate W is performed in the process chamber 10, the internal space 11 may be in a vacuum state. A vacuum pump may be connected to the internal space 11. In addition, the process chamber 10 may further include a sealing member which is provided between the upper chamber 12 and the lower chamber 14 to hermetically seal the internal space 11.

The supporting unit 20 may include a susceptor 22 and a supporting member 24 defining a supporting axis. The supporting unit 20 may support the substrate W. As an example, the susceptor 22 may include a loading part 23 holding or supporting the substrate W. The loading part 23 may be provided to have a size corresponding to that of the substrate W. The loading part 23 may be a recessed structure that is formed on or in a surface of the susceptor 22. The substrate W may be loaded on the loading part 23. In some embodiments, the susceptor 22 may include a plurality of loading parts 23. For example, as shown in FIG. 2, the susceptor 22 may include a plurality of loading parts 23 arranged in a circumferential direction or around a center axis thereof (e.g., around the supporting axis). The supporting member 24 may be coupled to the susceptor 22. The supporting member 24 may be configured to support and rotate the susceptor 22 about the supporting axis. According to a stage of the process, the supporting member 24 may be rotated to allow the substrate W to be disposed below a specific one of a plurality of gas supply parts 34a, 34b, 34c, and 34d which will be described below.

The gas supply unit 30 may be provided over the supporting unit 20. The gas supply unit 30 may be or include a shower head. The gas supply unit 30 may include a gas supply part 34. The gas supply part 34 may be configured to supply a process gas onto the substrate W. The gas supply unit 30 may include a plurality of gas supply parts 34. For example, as shown in FIG. 3A, the gas supply part 34 may include first, second, third, and fourth gas supply parts 34a, 34b, 34c, and 34d which are disposed in a clockwise direction or in a ring-shaped arrangement. Each of the first, second, third, and fourth gas supply parts 34a, 34b, 34c, and 34d may have an arc shape or profile. In some embodiments, an inner and outer edge of each of the gas supply parts has an arc shape and opposing side edges extending between the inner and outer edge are straight. Each of the gas supply parts may extend radially outwardly from a central portion or region of the gas supply unit 30 to an outer portion or region of the gas supply unit 30. In some embodiments, each of the gas supply parts has a circular sector shape with an arc shaped inner edge. However, in certain embodiments, each of the first, second, third, and fourth gas supply parts 34a, 34b, 34c, and 34d may have a shape different from the arc shape or profile. The first, second, third, and fourth gas supply parts 34a, 34b, 34c, and 34d may be configured to supply first, second, third, and fourth process gases, respectively, onto the substrate W. In some embodiments, the first and third process gases may be source gases for depositing a thin film on the substrate W, and the second and fourth process gases may be purge gases for purging an unreacted fraction of the source gases remaining in the internal space 11. The second and fourth gas supply parts 34b and 34d for supplying the purge gases and the first and third gas supply parts 34a and 34c for supplying the source gases may be alternately disposed, and this may make it possible to realize separate spaces according to kinds of the source gases and to inhibit or prevent different source gases from being mixed in the internal space 11.

The gas supply unit 30 may include a recess region 33 which has a recessed structure. The recess region 33 may be provided in the gas supply part 34, for example, between the plurality of gas supply parts 34a, 34b, 34c, and 34c. In addition, the recess region 33 may extend to outer sides or edges of the first, second, third, and fourth gas supply parts 34a, 34b, 34c, and 34d (e.g., at least a portion of the recess region 33 may be at the outer portion or region of the gas supply unit 30). A shape and position of the recess region 33 may be variously changed and may not be limited to that described above.

The gas supply part 34 may have a gas supply region 36 and a gas diffusion region 38. The gas supply part 34 may overlap with the substrate W disposed on the supporting unit 20 (e.g., the gas supply part 34 may be positioned over the substrate W). For example, each of the gas supply parts 34a, 34b, 34c, and 34d may overlap with the substrate or substrates W disposed on the supporting unit 20. The gas supply part 34 may have a size or area which is substantially equal to or larger than that of the substrate W. For example, each of the gas supply parts 34a, 34b, 35c, and 34d may have a size which is substantially equal to or larger than that of the substrate W. Accordingly, the gas supply region 36 may overlap with a portion of the substrate W and the gas diffusion region 38 may overlap with another portion of the substrate W (e.g., the gas supply region 36 may be positioned over a portion of the substrate W and the gas diffusion region 38 may be positioned over another portion of the substrate W). Hereinafter, the gas supply region 36 and the gas diffusion region 38 will be described in more detail with reference to the first gas supply part 34a.

Referring to FIG. 3B, the gas supply region 36 may include gas supply holes 37 for supplying the process gas onto the substrate W. For example, the gas supply holes 37 may be provided to supply the process gas stored in a gas storage unit onto the substrate W. By contrast, the gas supply holes 37 may not be provided in the gas diffusion region 38. The gas diffusion region 38 may have a flat, solid and/or uniform surface (e.g., a surface that is devoid of the gas supply holes 37). The gas diffusion region 38 may be provided to face the substrate W, and thus, an isolated space may be provided between the gas diffusion region 38 and the substrate W (e.g., a space without the gas supply holes 37 over the substrate W). The gas diffusion region 38 may be disposed between the gas supply region 36 and the exhaust unit 40. In some embodiments, the gas diffusion region 38 may include a first diffusion region provided between the gas supply region 36 and a first exhaust sub-region 44a and a second diffusion region provided between the gas supply region 36 and a second exhaust sub-region 44b, and the first and second diffusion regions may be connected to each other to form a single region. Alternatively, the gas diffusion region 38 may be locally provided at a portion of the first and second diffusion regions.

Figure 8:
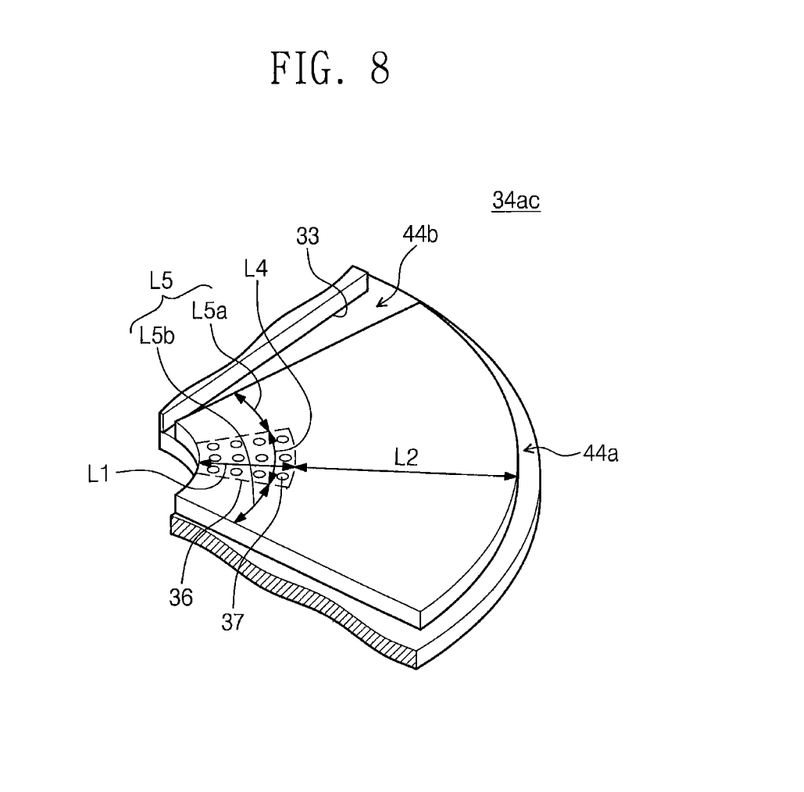
FIG. 8 is a perspective view illustrating a gas supply part according to some embodiments of the inventive concept.

FIG. 8 is a perspective view illustrating a gas supply part 34ac according to some embodiments of the inventive concept. Referring to FIGS. 3B and 8, the gas supply region 36 may have a first length L1, and the gas diffusion region 38 may have a second length L2. Here, the first length L1 may be a distance from an inner side or edge to an outer side or edge of the gas supply region 36, and the second length L2 may be a distance from an inner side or edge to an outer side or edge of the gas diffusion region 38. In other words, the first and second lengths L1 and L2 may be radial lengths of the gas supply region 36 and the gas diffusion region 38, respectively. As shown in FIG. 3B, the first length L1 may be greater than or at least equal to the second length L2. In certain embodiments, as shown in FIG. 8, the first length L1 may be smaller than the second length L2.

The gas supply holes 37 of the gas supply region 36 may be spaced apart from each other by a third length L3. The second length L2 may be several times to several thousand times the third length L3. In some embodiments, the second length L2 may be about five times to two hundred times longer than the third length L3. The gas diffusion region 38 may have an area that ranges from about 1/10 to about 10 times that of the gas supply region 36.

The gas supply region 36 and the gas diffusion region 38 may have a fourth length L4 and a fifth length L5, respectively, when measured in an arc or circumferential direction. As shown in FIG. 3B, the fourth length L4 may be greater than or at least equal to the fifth length L5. Alternatively, as shown in FIG. 8, the fourth length L4 may be smaller than the fifth length L5. In other words, the shapes or sizes of the gas supply region 36 and the gas diffusion region 38 may be variously modified. For example, the shapes of the gas supply region 36 and the gas diffusion region 38 may be changed depending on a kind or a flow rate of the process gas.

The exhaust unit 40 may be configured to exhaust the process gas in the internal space 11 to the outside of the process chamber 10. The exhaust unit 40 may include a first exhaust part 42 and a second exhaust part 44. For example, the first exhaust part 42 may be provided outside or spaced apart from the gas supply unit 30, and the second exhaust part 44 may be provided in or defined by the gas supply unit 30. As an example, the first exhaust part 42 may be an exhaust port penetrating a portion of the process chamber 10. Although the first exhaust part 42 is illustrated to pass through the upper chamber 12 in FIG. 1, the position and connection structure of the first exhaust part 42 may not be limited thereto. The second exhaust part 44 may be provided as a second exhaust region 44. In certain embodiments, the exhaust unit 40 may have only one of the first exhaust part 42 and the second exhaust part 44.

The second exhaust region 44 may be provided in or defined by the gas supply unit 30. The shape of the second exhaust region 44 may be variously changed. As an example, the second exhaust region 44 may include a first exhaust sub-region 44a and second exhaust sub-regions 44b. The first and second exhaust sub-regions 44a and 44b may correspond to the recess region 33 of the gas supply unit 30. For example, the first exhaust sub-region 44a may be a ring-shaped or circular region that is formed along outer circumferences, edges or sides of the gas supply parts 34a, 34b, 34c, and 34d, and each of the second exhaust sub-regions 44b may be a linear or arc-shaped region that is formed between the gas supply parts 34a, 34b, 34c, and 34d. Each of the second exhaust sub-regions 44b may have a circular sector shape with an arc shaped inner edge. The second exhaust sub-region may be tapered such that it widens from an inner edge to an outer edge at the first exhaust sub-region 44a. Since the gas supply unit 30 is thinner at the recess region 33 than at the gas supply part 34, a distance between the recess region 33 and the substrate W may be greater than a distance between the gas supply part 34 and the substrate W, and thus, pressure of the process gas may be lower in the recess region 33 than in a region between the gas supply part 34 and the substrate W. Owing to the difference in pressure of the process gas, the process gas may flow toward the recess region 33, and the recess region 33 may serve as the second exhaust region 44. The second exhaust region 44 may be configured to allow the process gases to flow smoothly in the gas supply unit 30 and to inhibit or prevent the process gases from being mixed with each other, and its shape and arrangement may be variously changed.

The heating unit 50 may be provided below the supporting unit 20. The heating unit 50 may be configured to uniformly heat the substrates W disposed on the supporting unit 20 and may have a shape corresponding to each of the loading parts 23 of the supporting unit 20. As an example, the heating unit 50 may have a ring or circular shape. The heating unit 50 may be used to control a temperature of the substrate W, and thus, it is possible to control a process of depositing a thin film on the substrate W. Although the heating unit 50 and the supporting unit 20 are illustrated to be individual components in FIG. 1, the heating unit 50 may be embedded in or coupled to the supporting unit 20.

Figure 4A:
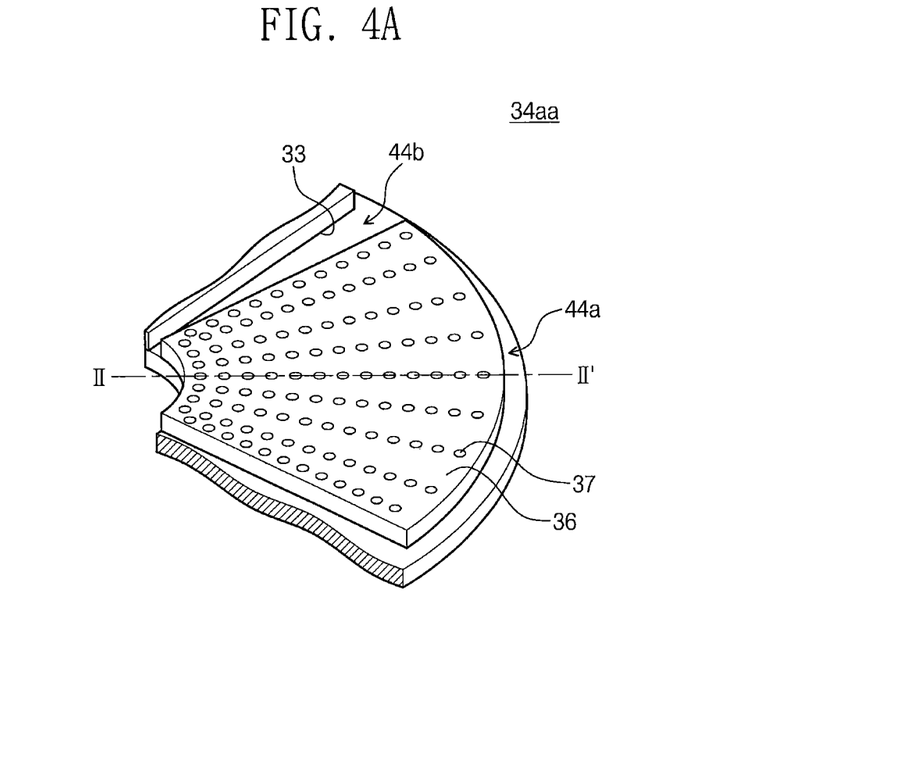
FIG. 4A is a perspective view illustrating a conventional gas supply part.
Figure 4B:
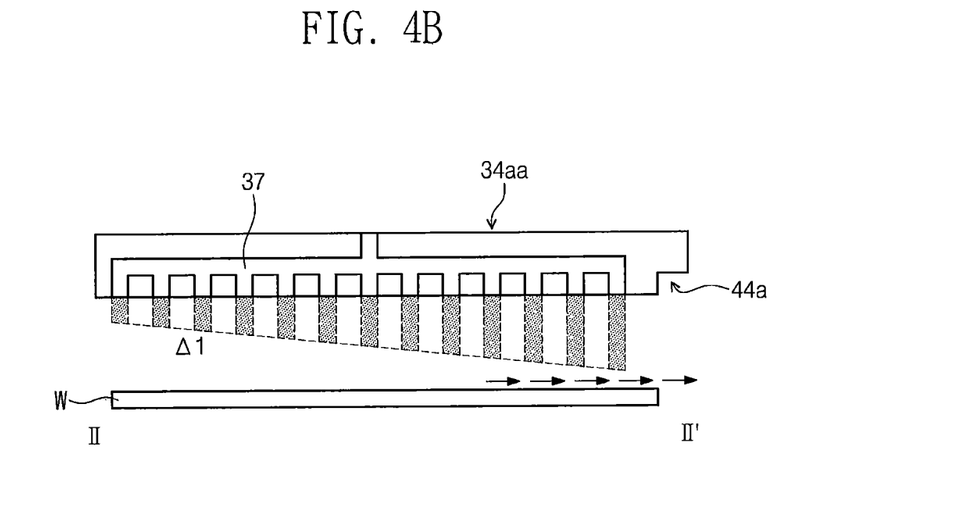
FIG. 4B is a sectional view taken along line II-II' of FIG. 4A.
Figure 5A:
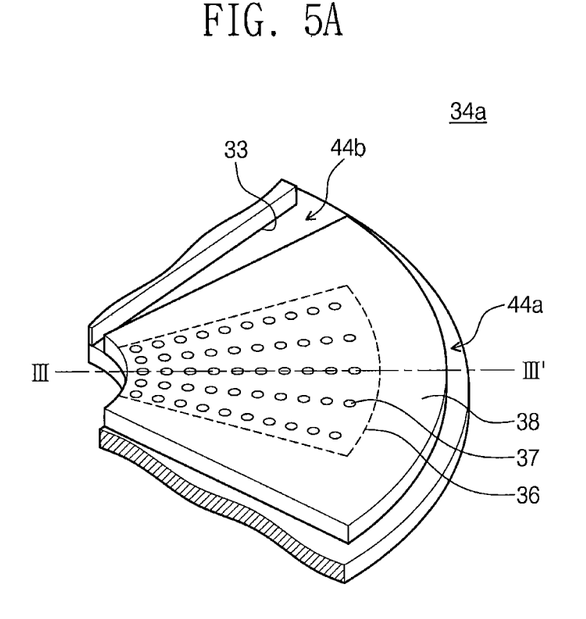
FIG. 5A is a perspective view illustrating a gas supply part of FIG. 3A.
Figure 5B:
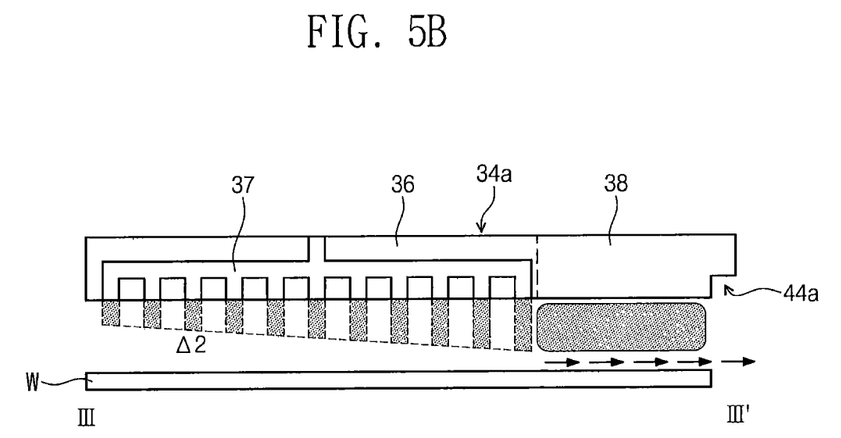
FIG. 5B is a sectional view taken along line of FIG. 5A.

FIG. 4A is a perspective view illustrating a conventional gas supply part 34aa, and FIG. 4B is a sectional view taken along line II-II' of FIG. 4A. FIG. 5A is a perspective view illustrating a gas supply part of FIG. 3A, and FIG. 5B is a sectional view taken along line of FIG. 5A. Gas supply parts according to embodiments described herein may be configured to have the same features, and thus, for the sake of simplicity, the first gas supply part 34a will be described as an example of such gas supply parts. For concise description, an element previously described with reference to FIGS. 3A and 3B may be identified by a similar or identical reference number without repeating a description thereof.

According to the conventional technology, as shown in FIGS. 4A and 4B, the gas supply holes 37 may be provided throughout the entire region of the gas supply part 34aa. Accordingly, the gas supply holes 37 may be provided over the entire substrate W or over the entire region of the substrate W. There may be a difference in pressure between two regions located adjacent and spaced apart from the exhaust unit 40 when a process gas is supplied onto the substrate W through the gas supply part 34aa, and this may cause the process gas to be more rapidly exhausted through a region adjacent the exhaust unit 40. As an example, a large Δ1 in an amount of the process gas to be supplied to the substrate W may occur, for example, depending on a distance from the exhaust unit 40. Accordingly, a thickness of a layer deposited on the substrate W may be smaller on the region spaced apart from the exhaust unit 40 than on the region adjacent the exhaust unit 40. In this case, to form a uniform layer on the entire substrate W or the entire region of the substrate W, it may be necessary to increase a supply amount of the process gas.

By contrast, in the gas supply part 34a according to some embodiments of the inventive concept, as shown in FIGS. 5A and 5B, the gas supply holes 37 may be provided in the gas supply region 36 that is spaced apart from the exhaust unit 40, but not in the gas diffusion region 38 adjacent the exhaust unit 40. Since the gas diffusion region 38 is provided to have a flat surface (e.g., that is devoid of gas supply holes 37), an isolated space may be provided between the gas supply part 34a and the substrate W. Accordingly, the process gas supplied through the gas supply holes 37 of the gas supply region 36 may be diffused when it flows through a space located below the gas diffusion region 38. In other words, by separating the gas supply holes 37 from the exhaust unit 40, it is possible to reduce not only a difference in pressure between the gas supply holes 37 but also a gradient Δ2 in a supply amount of the process gas. For example, it is possible to prevent the process gas from being directly exhausted to the exhaust unit 40 and, as a result, the process gas may be controlled to be uniformly supplied onto the entire substrate W or the entire region of the substrate W.

Figure 6A:
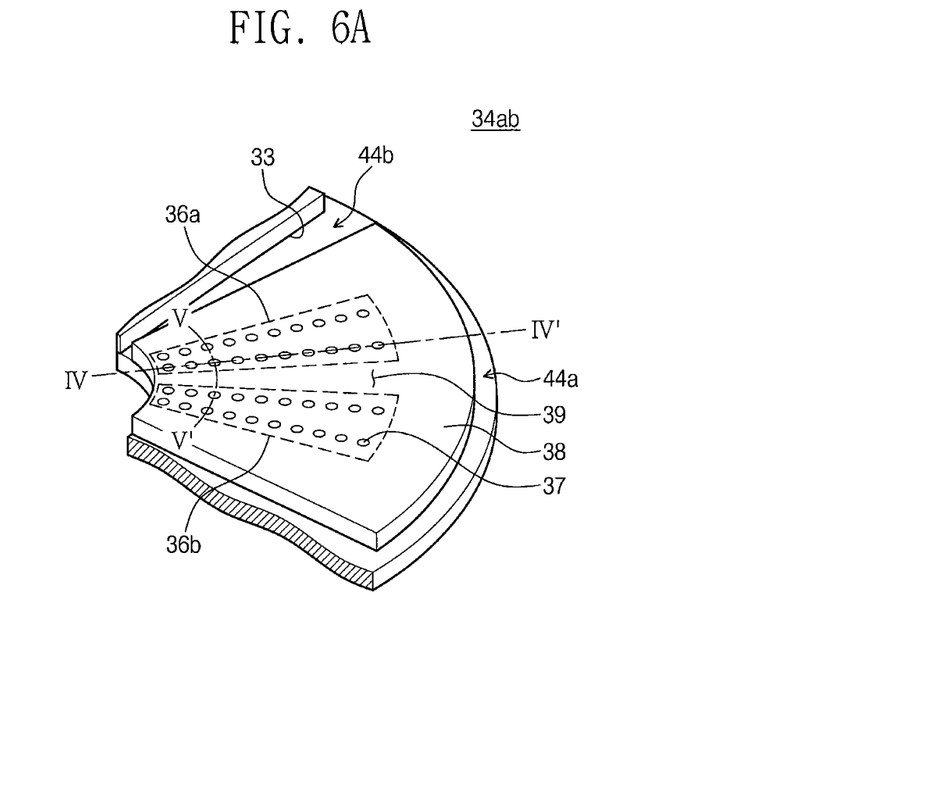
FIG. 6A is a perspective view illustrating a gas supply part according to some embodiments of the inventive concept.
Figure 6B:
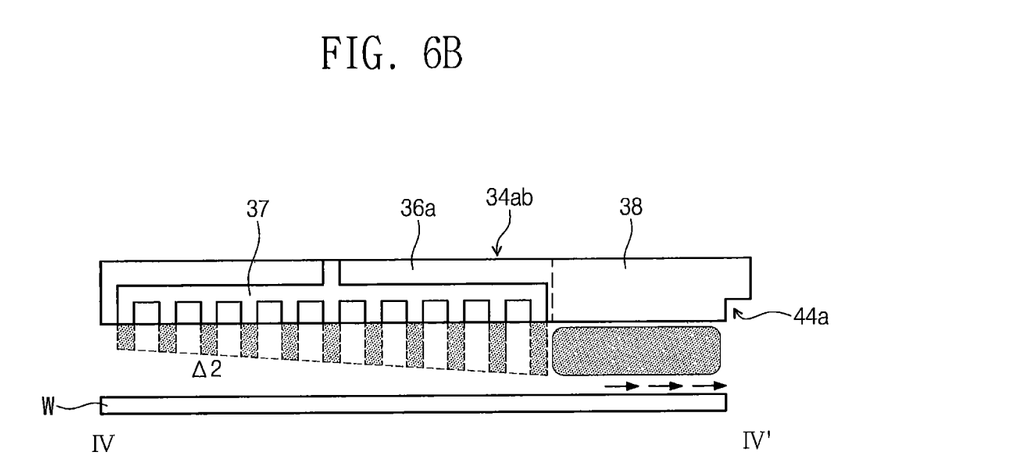
FIGS. 6B and 6C are sectional views taken along line IV-IV' and V-V', respectively, of FIG. 6A.
Figure 6C:
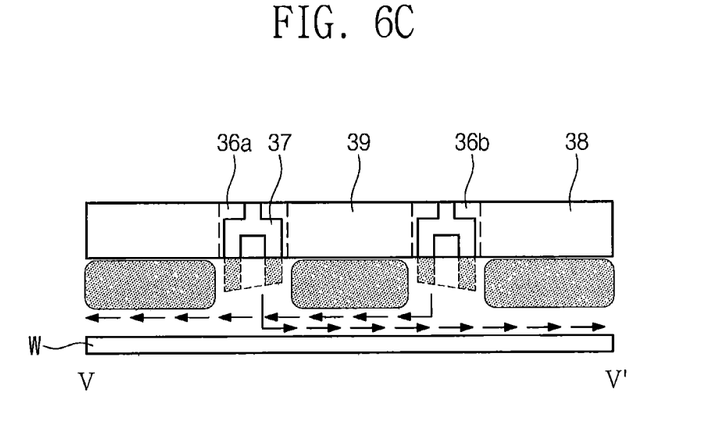
Figure 7:
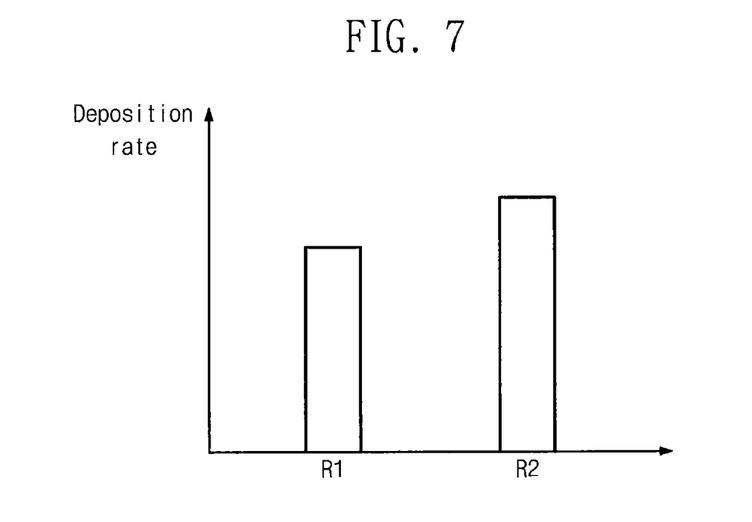
FIG. 7 is a graph showing deposition rates of layers that are deposited on a substrate when a process gas is supplied onto a substrate using a gas supply part of FIG. 6A.

FIG. 6A is a perspective view illustrating a gas supply part 34ab according to some embodiments of the inventive concept, and FIGS. 6B and 6C are sectional views taken along line IV-IV' and V-V', respectively, of FIG. 6A. FIG. 7 is a graph showing deposition rates of layers which are deposited on the substrate W when a process gas is supplied onto the substrate W using the gas supply part 34ab of FIG. 6A.

Referring to FIG. 6A, a plurality of gas supply regions 36a and 36b may be formed on the gas supply part 34ab. For example, the gas supply part 34ab may include the first and second gas supply regions 36a and 36b that are spaced apart from each other. Here, the gas diffusion region 38 may further include a second gas diffusion region 39 disposed between the first and second gas supply regions 36a and 36b. The gas diffusion region 38 and the second gas diffusion region 39 may be connected to each other. The gas diffusion region 38 may be referred to herein as the first gas diffusion region 38.

In the case of the gas supply part 34ab according to some embodiments of the inventive concept, as shown in FIGS. 6A to 6C, the gas supply holes 37 may be provided in the first and second gas supply regions 36a and 36b, which are spaced apart from the exhaust unit 40, but the gas supply holes 37 may not be provided in the gas diffusion region 38 and the second gas diffusion region 39. The gas diffusion region 38 and the second gas diffusion region 39 may be provided to have flat, solid or uniform surfaces, and thus, it is possible to provide an isolated space between the gas supply part 34ab and the substrate W and to diffuse the process gas. This may make it possible to reduce a difference in pressure between the gas supply holes 37 and a gradient in a supply amount of the process gas. For example, it is possible to prevent the process gas from being directly exhausted to the exhaust unit 40 and, as a result, the process gas may be controlled to be uniformly supplied onto the entire substrate W or the entire region of the substrate W.

In the graph of FIG. 7, R1 represents a deposition rate in a deposition process using the gas supply part 34aa of FIG. 4A and R2 represents a deposition rate in a deposition process using the gas supply part 34ab of FIG. 6A. In the case where the gas supply part 34ab of FIG. 6A is used, it is possible to increase a deposition rate of a layer to be deposited on the substrate W compared with the gas supply part 34aa of FIG. 4A. As an example, the deposition rate may be increased by about 10% to 20%. Thus, it is possible to improve uniformity in a supply amount of the process gas and to reduce loss of the process gas. In other words, the use of the gas supply part 34ab of FIG. 6A may make it possible to reduce an amount of the process gas, which is consumed to deposit a layer of the same thickness, compared with the gas supply part 34aa of FIG. 4A.

Figure 9:
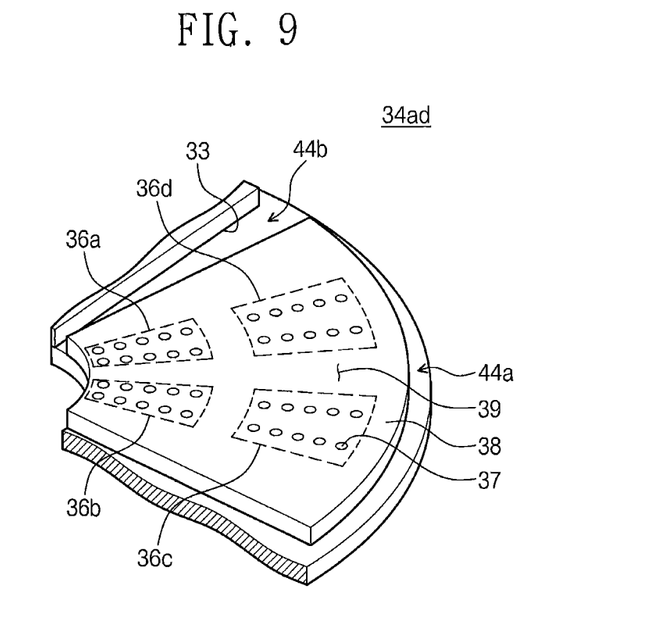
FIG. 9 is a perspective view illustrating a gas supply part according to some embodiments of the inventive concept.
Figure 10:
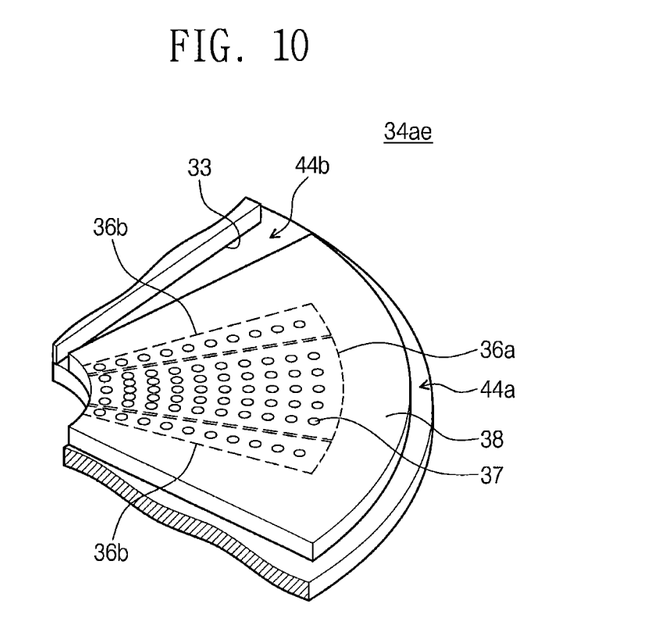
FIG. 10 is a perspective view illustrating a gas supply part according to some embodiments of the inventive concept.

FIG. 9 is a perspective view illustrating a gas supply part 34ad according to some embodiments of the inventive concept, and FIG. 10 is a perspective view illustrating a gas supply part 34ae according to some embodiments of the inventive concept. Referring to FIG. 9, a plurality of gas supply regions 36a, 36b, 36c, and 36d may be provided on the gas supply part 34ad. The plurality of gas supply regions 36a, 36b, 36c, and 36d may be disposed spaced apart from each other in circumferential and radial directions. Here, the gas diffusion region 38 may further include a second gas diffusion region 39 disposed between the gas supply regions 36a, 36b, 36c, and 36d. Alternatively, as shown in FIG. 10, the gas supply part 34ae may be configured to include at least two different gas supply regions, whose gas supply hole densities are different from each other. For example, the gas supply part 34ae may include a first gas supply region 36a having a high gas supply hole density and second gas supply regions 36b having a low gas supply hole density. The first gas supply region 36a may be provided at a center region of the gas supply part 34ae. Accordingly, it is possible to increase an amount of the process gas to be supplied to the center region of the gas supply part 34ae spaced apart from the exhaust unit 40 and consequently to reduce a difference in a supply amount of the process gas which may be caused by the pressure difference.

As described above, according to some embodiments of the inventive concept, the gas supply unit 30 may include the gas supply region 36, which is configured to directly supply the process gas onto the substrate W, and the gas diffusion region 38, which is configured to provide a space for diffusing the process gas without any direct supply of the process gas. Since the space for diffusing the process gas is provided between the gas supply region 36 and the exhaust unit 40, it is possible to prevent the process gas supplied into a chamber from being immediately exhausted to the exhaust unit 40, even when there is a gradient in an internal pressure of the chamber, and to supply the process gas onto the entire substrate W or the entire region of the substrate W. Furthermore, it is possible to reduce a consumption amount of the process gas and to improve uniformity in thickness of a layer to be deposited on the substrate W.

In some embodiments, the gas supply unit 30 has been described to have the recess region 33 that is formed on or in a surface thereof to form a plurality of gas supply parts, but in certain embodiments, the gas supply part 34 may be provided as a separate component. Also, in some embodiments, the gas supply unit 30 has been described to be in contact with the upper chamber 12, but in certain embodiments, the gas supply unit 30 may be provided to be spaced apart from the upper chamber 12. In addition, a connection position between the gas supply unit 30 and the process chamber 10 may be changed.

In some embodiments, the gas supply parts 34a, 34b, 34c, and 34d have been described to have the same shape and structure, but in certain embodiments, in each of the gas supply parts 34a, 34b, 34c, and 34d, the shapes of the gas supply region 36 and the gas diffusion region 38 may be changed depending on a kind or property of the process gas to be supplied therethrough. The shapes of the gas supply region 36 and the gas diffusion region 38 may not be limited to those described above and may be changed in various ways. In addition, the gas supply unit 30 may include an additional gas supply part provided at a center region thereof.

According to some embodiments of the inventive concept, a space for diffusing a process gas may be provided between a gas supply region and an exhaust unit, and thus, it is possible to prevent the process gas supplied into a chamber from being immediately exhausted to the exhaust region, even when there is a gradient in an internal pressure of the chamber, and to uniformly supply the process gas onto the entire substrate or the entire region of a substrate. Furthermore, it is possible to reduce a consumption amount of the process gas and to improve uniformity in thickness of a thin-film to be deposited on the substrate.

While example embodiments of the inventive concept have been particularly shown and described, it will be understood by one of ordinary skill in the art that variations in form and detail may be made therein without departing from the spirit and scope of the attached claims.

What is claimed is:

1. A substrate processing system comprising:
    a process chamber in which a process on a substrate is performed;
    a susceptor in the process chamber and configured to support the substrate;
    a gas supply unit including a gas supply part with gas supply holes, the gas supply holes being configured to supply a process gas onto the substrate; and
    a recess region provided in the gas supply unit that extends continuously around an outer circumferential portion of the gas supply unit, the recess region formed on a surface of the gas supply unit that faces the susceptor and the recess region configured to exhaust the process gas from the process chamber,
    wherein the gas supply part protrudes from the surface of the gas supply unit toward the susceptor and includes a gas supply region provided with the gas supply holes and a gas diffusion region between the gas supply region and the recess region,
    the gas diffusion region is free of the gas supply holes,
    the gas supply part extends radially outwardly from a central portion of the gas supply unit to the outer portion of the gas supply unit,
    the gas supply region is adjacent the central portion of the gas supply unit, and
    the gas diffusion region is between the gas supply region and the recess region that extends around the outer portion of the gas supply unit.

2. The substrate processing system of claim 1, wherein the gas supply part overlaps the substrate that is supported by the susceptor with the gas supply region overlapping a portion of the substrate and the gas diffusion region overlapping another portion of the substrate.

3. The substrate processing system of claim 1, wherein the gas diffusion region has a flat surface facing the substrate.

4. The substrate processing system of claim 1, wherein the gas diffusion region is a first gas diffusion region, and wherein the gas supply region comprises a plurality of gas supply regions and the gas diffusion region further comprises a second gas diffusion region between the plurality of gas supply regions.

5. The substrate processing system of claim 1, further comprising a first exhaust part provided outside the gas supply unit and a second exhaust part, wherein the second exhaust part comprises the recess region.

6. The substrate processing system of claim 5, wherein the gas supply unit comprises:
    a first gas supply part configured to supply a first gas; and
    a second gas supply part configured to supply a second gas,
    wherein the recess region is between the first and second gas supply parts.

7. The substrate processing system of claim 5, wherein the recess region is configured to have a pressure lower than pressures at the gas supply region and the gas diffusion region when the gas supply unit supplies the process gas onto the substrate.

8. The substrate processing system of claim 1, wherein the gas supply part has an arc shape, and
    a radial length of the gas supply region is greater than or equal to a radial length of the gas diffusion region.

9. The substrate processing system of claim 1, wherein the gas supply part has an arc shape, and a radial length of the gas supply region is smaller than a radial length of the gas diffusion region.

10. The substrate processing system of claim 1, wherein the gas supply part has an arc shape, and
an arc length of the gas supply region is greater than or equal to an arc length of the gas diffusion region.

11. The substrate processing system of claim 1, wherein the gas supply part has an arc shape, and
an arc length of the gas supply region is smaller than an arc length of the gas diffusion region.

12. The substrate processing system of claim 1, wherein the gas supply part has a bottom surface facing the susceptor, the recess region has a bottom surface facing the susceptor, and the bottom surface of the gas supply part is closer to the susceptor than is the bottom surface of the recess region.

13. A substrate processing system comprising:
a process chamber defining an internal space;
a susceptor in the internal space of the process chamber and supporting a substrate;
a gas supply unit at a top portion of the process chamber, comprising a gas supply part comprising gas supply holes configured to supply a process gas to the substrate; and
a recessed region provided in the gas supply unit that extends continuously around an outer circumferential portion of the gas supply unit, the recessed region configured to exhaust the process gas from the process chamber,
wherein the gas supply part comprises a gas supply region including a bottom surface through which the gas supply holes extend and a gas diffusion region including a flat, solid bottom surface,
wherein the susceptor is configured such that the substrate is positionable under the gas supply part with the gas supply region over a first portion of the substrate and the gas diffusion region over a second, different portion of the substrate,
the gas supply part extends radially outwardly from a central portion of the gas supply unit to the outer portion of the gas supply unit,
the gas supply region is adjacent the central portion of the gas supply unit,
the gas diffusion region is between the gas supply region and the recessed region that extends around the outer portion of the gas supply unit, and
the recessed region is formed on a surface of the gas supply unit that faces the susceptor and the gas supply part protrudes from the surface of the gas supply unit toward the susceptor.

14. The substrate processing system of claim 13, wherein the gas supply part is a first gas supply part, the gas supply unit further comprising a second gas supply part that is spaced apart from the first gas supply part, a third gas supply part that is spaced apart from the second gas supply part, and a fourth gas supply part that is spaced apart from the third gas supply part, and wherein the recessed region extends between alternating ones of the first through fourth gas supply parts.

15. The substrate processing system of claim 13, wherein the gas supply region is a first gas supply region and the gas diffusion region is a first gas diffusion region, the gas supply part further comprising a second gas supply region that is spaced apart from the first gas supply region and a second gas diffusion region that extends continuously between the first and second gas supply regions.

16. The substrate processing system of claim 13, wherein the gas supply unit is configured such that the process gas that is supplied from the gas supply holes is diffused to a space between the gas diffusion region and the substrate.

17. A substrate processing system comprising:
a process chamber in which a process on a substrate is performed;
a susceptor in the process chamber and configured to support the substrate;
a gas supply unit including a gas supply part that is configured to supply a process gas onto the substrate; and
a recess region provided in the gas supply unit that extends continuously around an outer circumferential portion of the gas supply unit, the recess region formed on a surface of the gas supply unit that faces the susceptor and the recess region configured to exhaust the process gas from the process chamber,
wherein the gas supply part protrudes from the surface of the gas supply unit toward the susceptor and comprises:
a gas supply region comprising first and second spaced apart gas supply regions that each extend radially outwardly from a central portion of the gas supply unit, the gas supply region configured to supply the process gas onto the substrate; and
a gas diffusion region that provides a space allowing the process gas to be diffused on the substrate,
wherein the gas diffusion region comprises:
a first gas diffusion region provided between the gas supply region and the recess region; and
a second gas diffusion region provided between the first and second gas supply regions and that extends continuously circumferentially between the first and second gas supply regions,
the gas supply unit has a first thickness at the gas supply region and the gas diffusion region and a second thickness at the recess region, and
the first thickness is greater than the second thickness.

18. The substrate processing system of claim 17, wherein the gas supply region includes gas supply holes for supplying the process gas, and wherein the gas diffusion region has a flat surface that is devoid of gas supply holes facing the substrate.

19. The substrate processing system of claim 18, wherein the gas supply part is positioned to overlap the substrate supported by the susceptor with the gas supply region overlapping a portion of the substrate and the gas diffusion region overlapping another portion of the substrate.

20. The substrate processing system of claim 17, further comprising a first exhaust part provided outside the gas supply unit and a second exhaust part provided in the gas supply unit, wherein the second exhaust part is provided as a second exhaust region, and wherein the recess region is used as the second exhaust region.

* * * * *